US010218330B2

(12) United States Patent
Park et al.

(10) Patent No.: US 10,218,330 B2
(45) Date of Patent: Feb. 26, 2019

(54) LAMINATED CHIP DEVICE

(71) Applicant: INNOCHIPS TECHNOLOGY CO., LTD., Ansan-Si, Gyeonggi-Do (KR)

(72) Inventors: In Kil Park, Seongnam-Si (KR); Tae Hyung Noh, Siheung-Si (KR); Gyeong Tae Kim, Ansan-Si (KR); Myung Ho Lee, Ansan-Si (KR); Tae Geun Seo, Osan-Si (KR); Min Soo Lee, Daejeon (KR); Song Yeon Lee, Ansan-Si (KR)

(73) Assignee: INNOCHIPS TECHNOLOGY CO., LTD. (KR)

( * ) Notice: Subject to any disclaimer, the term of this patent is extended or adjusted under 35 U.S.C. 154(b) by 518 days.

(21) Appl. No.: 15/073,622

(22) Filed: Mar. 17, 2016

(65) Prior Publication Data

US 2016/0276995 A1 Sep. 22, 2016

(30) Foreign Application Priority Data

Mar. 17, 2015 (KR) ........................ 10-2015-0036678

(51) Int. Cl.
| H03H 1/00 | (2006.01) |
| H01G 4/30 | (2006.01) |
| H01G 4/40 | (2006.01) |
| H01F 17/00 | (2006.01) |
| H01F 27/28 | (2006.01) |
| H01G 4/005 | (2006.01) |
| H03H 7/01 | (2006.01) |
| H01G 4/232 | (2006.01) |

(52) U.S. Cl.
CPC ........... H03H 1/00 (2013.01); H01F 17/0013 (2013.01); H01F 27/2804 (2013.01); H01G 4/005 (2013.01); H01G 4/30 (2013.01); H01G 4/40 (2013.01); H03H 7/0115 (2013.01); H01F 2017/002 (2013.01); H01F 2017/0026 (2013.01); H01F 2027/2809 (2013.01); H01G 4/232 (2013.01); H03H 2001/0085 (2013.01)

(58) Field of Classification Search
CPC ........ H01L 2924/0002; H01L 2924/00; H01G 4/40; H01G 4/30
USPC ......................................... 361/270
See application file for complete search history.

(56) References Cited

U.S. PATENT DOCUMENTS 5,818,313 A * 10/1998 Estes ..................... H01P 1/2039
333/202
5,834,992 A * 11/1998 Kato ......................... H03H 5/02
333/185

(Continued)

FOREIGN PATENT DOCUMENTS

JP       6275436 A    9/1994
JP    2000151324 A    5/2000

(Continued)

*Primary Examiner* — Dharti H Patel
(74) *Attorney, Agent, or Firm* — Renaissance IP Law Group LLP

(57) ABSTRACT

Provided is a laminated chip device including a first laminate in which a plurality of conductor patterns formed on a plurality of sheets are connected to each other through a via formed to penetrate at least a sheet, and a second laminate provided over or below the first laminate and having a plurality of internal electrode patterns formed on a plurality of sheets, and the internal electrode patterns have a nonconductive region in at least a portion of an area corresponding to the via.

10 Claims, 6 Drawing Sheets

(56) References Cited

U.S. PATENT DOCUMENTS

| | | | | |
|---|---|---|---|---|
| 5,892,415 A * | 4/1999 | Okamura | ............ | H01P 1/20345 333/175 |
| 6,133,809 A * | 10/2000 | Tomohiro | ............ | H03H 7/0115 333/184 |
| 6,768,399 B2 * | 7/2004 | Uriu | .................... | H01P 1/20345 333/185 |
| 7,924,116 B2 * | 4/2011 | Ono | ...................... | H01P 1/2135 333/126 |
| 2002/0117746 A1 * | 8/2002 | Yoshikawa | ......... | H01L 21/4857 257/703 |
| 2004/0000968 A1 * | 1/2004 | White | .................. | H01F 41/041 333/185 |
| 2010/0046130 A1 * | 2/2010 | Park | .................... | H01F 17/0033 361/56 |

FOREIGN PATENT DOCUMENTS

| | | | |
|---|---|---|---|
| JP | 2001143965 A | 5/2001 | |
| JP | 2005229434 A | 8/2005 | |
| JP | 20135578 A | 1/2013 | |
| KR | 10578296 B1 | 5/2006 | |
| KR | 20110049200 A | 5/2011 | |

* cited by examiner

LAMINATED CHIP DEVICE

CROSS-REFERENCE TO RELATED APPLICATION

This application claims priority to Korean Patent Application No. 10-2015-0036678 filed on Mar. 17, 2015 and all the benefits accruing therefrom under 35 U.S.C. § 119, the contents of which are incorporated by reference in their entirety.

BACKGROUND

The present disclosure relates to a laminated chip device, and more particularly, to a laminated chip device in which at least two unit devices having different characteristics are combined in a single chip.

A resistor (R), a capacitor (C), and an inductor (L) are typical passive devices in an electronic circuit, and these typical passive devices have a great variety of functions and roles. For example, the resistor serves to control the flow of current flowing through a circuit and achieve an impedance matching in an alternating current circuit. Although the capacitor basically serves to cut off a direct current and pass an alternating current, the capacitor serves to constitute a time constant circuit, a time delay circuit, and RC and LC filter circuits, and the capacitor itself also serves to eliminate a noise. The inductor performs functions of eliminating a high-frequency noise, matching impedance, or the like.

Further, a varistor changes in resistance according to an applied voltage, and has thus been widely used as a protective device for protecting important electronic components and a circuit from an overvoltage (a surge voltage) and static electricity. That is, a current does not flow in the varistor under a normal condition; however, when an overvoltage exceeding a predetermined level of voltage is applied to both ends of the varistor, a resistance of the varistor drastically decreases to allow most current to flow through the varistor, so that the current does not flow in other devices, thereby protecting the circuit from the overvoltage. The varistor tends to be miniaturized and arrayed to protect a highly integrated circuit and the like from a static electricity and overvoltage according to miniaturization of electronic apparatuses.

Alternatively, at least two unit devices having different features from each other may be combined to form a single chip. For example, the varistor and the resistor may be combined to effectively protect important electronic components or circuits from the overvoltage. Also, combination of a varistor and an inductor, combination of a varistor and a capacitor, or combination of an inductor and a capacitor may eliminate a noise component to ensure the stable operation of the electric component or circuit.

As described above, in the case where at least two unit devices are combined in a single chip, the chip is manufactured by laminating a plurality of sheets in a vertical direction, and a conductor pattern such as an electrode to implement each device is formed on each sheet. Furthermore, in the laminated chip device, a through-hole is formed to penetrate each sheet, and the through-hole is filled with a conductor to connect the conductor patterns to each other in a vertical direction. Since the chip is manufactured by laminating and compressing the plurality sheets, a stress is accumulated in a region in which the through-hole is formed and particularly in a region in which the through-holes overlap with each other to result in deformation of the conductor in the through-hole, thus causing a distance between the conductor and the conductor pattern adjacent thereto to become smaller than the distance as originally designed. Thus, the laminated chip device fails to implement designed characteristics properly, and in the case where the conductor in the through-hole is severely deformed, the electricity is locally concentrated to cause occurrence of a short circuit, a leakage current, or a transient current.

RELATED ART DOCUMENT

Patent Document
 (Document 0001) Korean Patent No. 10-0578296

SUMMARY

The present disclosure provides a laminated chip device in which unit devices having different characteristics from each other are laminated on a single chip.

The present disclosure also provides a laminated chip device capable of preventing a stress caused by an overlap of through-holes, and accordingly suppressing a short circuit, a leakage current, or a transient current.

In accordance with an aspect of the present disclosure, a laminated chip device includes: a first laminate including a plurality of conductor patterns respectively provided on a plurality of sheets, the conductor patterns being vertically connected to each other through a via formed to penetrate at least a sheet; and a second laminate disposed over and below the first laminate and including a plurality of internal electrode patterns provided on a plurality of the sheets, and the internal electrode patterns are provided with a non-conductive region in at least a portion of a region corresponding to the via.

The first laminate may include at least one inductor, and the second laminate may include at least one capacitor.

The conductor patterns may include at least one lead pattern extending in one direction and in another direction opposed thereto to be exposed, and a plurality of coil patterns provided between the lead patterns, and the lead pattern and the plurality of coil patterns may be connected to each other in a vertical direction through the via.

The via may include a first and second end vias provided on end portions of the conductor pattern to be spaced apart from each other in a vertical direction, and a first and second center vias provided on a central portion of the conductor pattern to be spaced apart from each other in a vertical direction.

22 sheets may be laminated in the first laminate, the lead patterns may be respectively provided on uppermost and lowermost sheets respectively, the coil patterns may be respectively provided on the remaining 20 sheets between the uppermost and lowermost sheets, and the coil pattern and the lead pattern may be connected to each other in a vertical direction through four vias provided on each sheet.

The internal electrode may include an electrode pattern provided on one sheet and exposed in the same direction as that of the lead pattern, and common electrode patterns provided over and below the electrode pattern and exposed in a direction perpendicular to the electrode pattern.

The common electrode pattern may be provided in a region in which the conductor pattern including the first and second end vias is included.

The common electrode pattern may include an upper common electrode and a lower common electrode which are respectively provided over and blow the electrode pattern, the non-conductive region being provided on at least one of the upper and lower common electrode patterns.

The common electrode pattern may be provided on a sheet, and the non-conductive region may include a region in which the sheet is exposed by removing a portion of the common electrode pattern.

The non-conductive region may be provided to have a size which is equal to or greater than that of the via.

BRIEF DESCRIPTION OF THE DRAWINGS

Exemplary embodiments may be understood in more detail from the following description taken in conjunction with the accompanying drawings, in which.

DETAILED DESCRIPTION OF EMBODIMENTS

Figure 1:
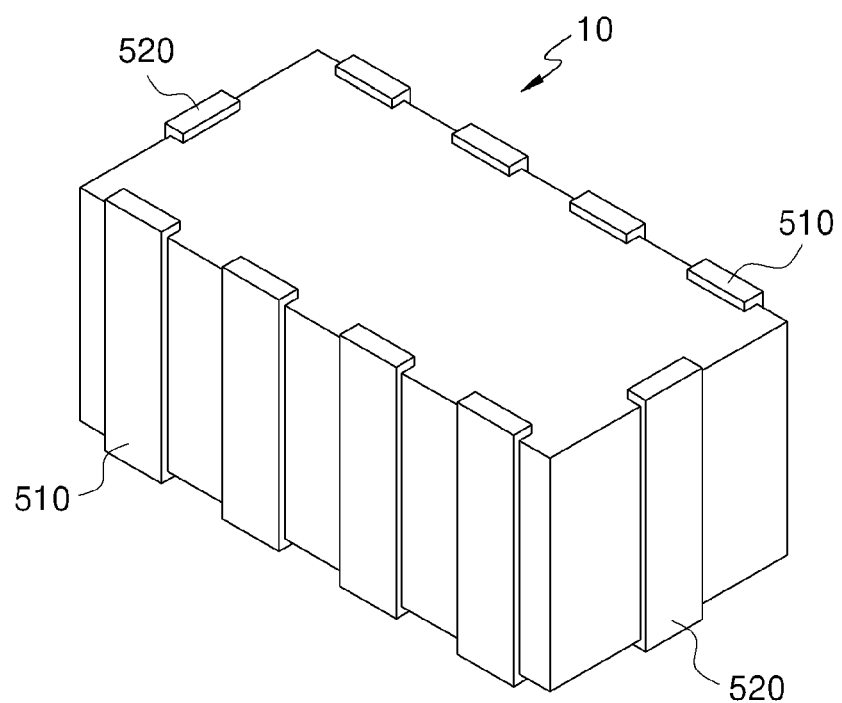
FIG. 1 is a combined perspective view of a laminated chip device in accordance with an exemplary embodiment of the present disclosure.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, a thickness is illustrated to be enlarged for clarity of illustration of layers and regions, and same reference numerals refer to same elements throughout.

Figure 2:
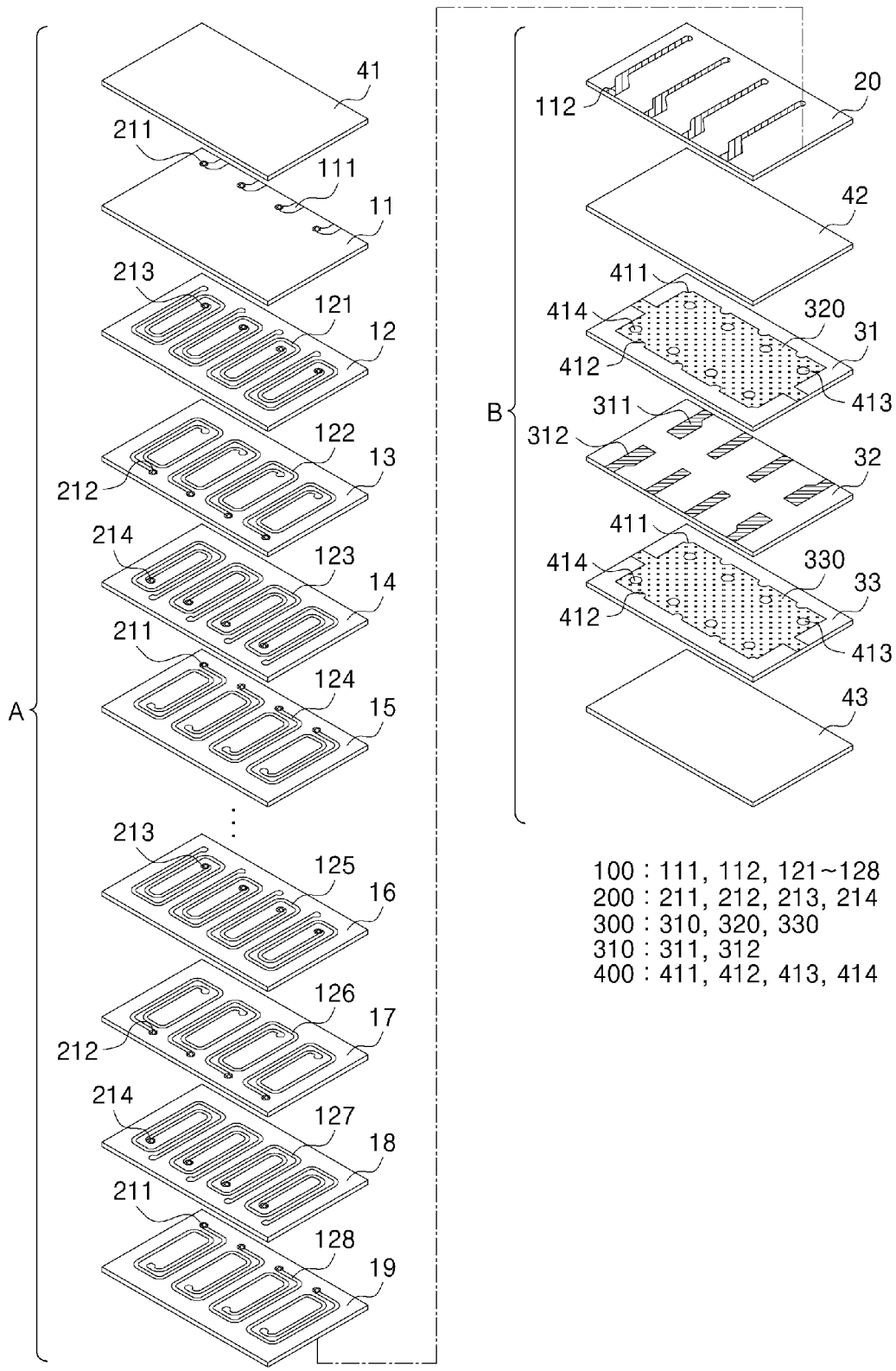
FIG. 2 is a exploded perspective view of a laminated chip device in accordance with an exemplary embodiment of the present disclosure.

FIG. 1 is a combined perspective view of a laminated chip device in accordance with an exemplary embodiment of the present disclosure, and FIG. 2 is an exploded perspective view of the same.

Referring to FIGS. 1 and 2, the laminated chip device in accordance with an exemplary embodiment includes: a first laminate A having a plurality of conductor patterns 100; and a second laminate B provided over or below the first laminate A and having a plurality of electrode patterns 310 respectively provided in unit devices, and common electrode patterns 320 and 330 provided to be connected to each other across unit device regions. Also, the laminated chip device further includes a plurality of external electrodes 500 provided on outer side surfaces of a laminate 10 in which the first and second laminates A and B are laminated. Herein, the conductor patterns 100 are provided on a plurality of sheets 11 to 24 and vertically connected to each other through vias 200 formed to penetrate at least one sheet. Also, the first and second laminates A and B may be laminates of a device each having desired characteristics. For example, the first laminate A may be a laminate in which inductors are provided in plurality, and the second laminate B may be a laminate in which capacitors are provided in plurality. Meanwhile, the sheet used in the first and second laminates A and B is a laminated sheet in which a plurality of sheets having predetermined patterns thereon are laminated, and may be made of a ceramic material or other material different therefrom. For example, the sheet may be a semi-conductive ceramic sheet, insulating ceramic sheet, or a varistor material sheet. Also, the sheets made of the same material may be used for all laminates, or each laminate may be made of a different material.

The first laminate A may include the plurality of sheets 11 to 20, the conductor patterns 100 formed on the plurality of sheets 11 to 20, and the vias 200 selectively formed on the plurality of sheets 11 to 20 to vertically connect the conductor patterns 100 to each other.

Figure 3:
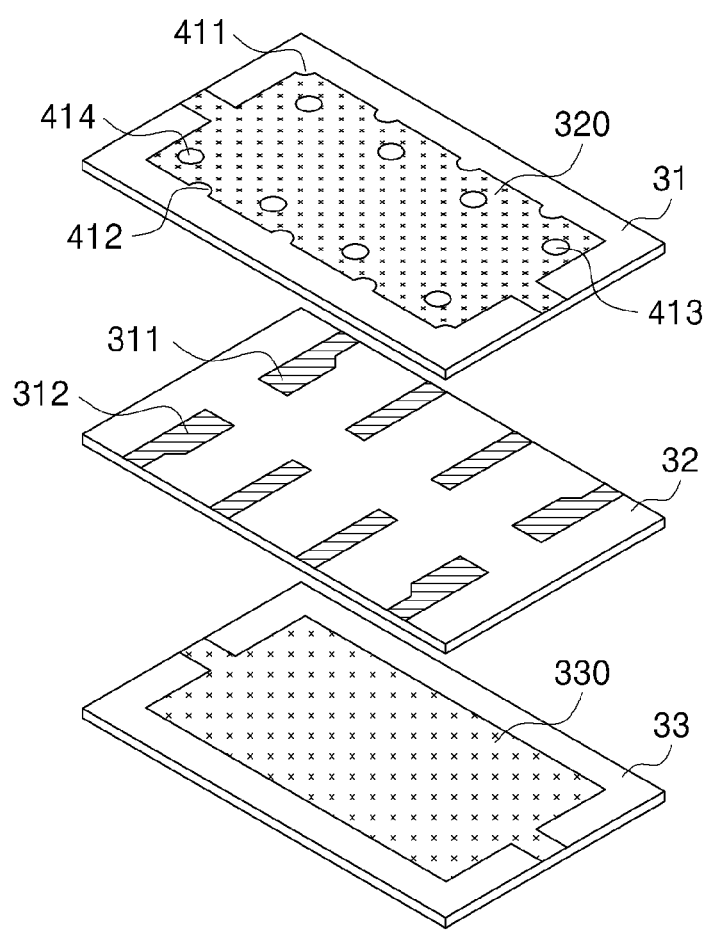
FIGS. 3 to 6 are partial exploded perspective views in accordance with another exemplary embodiment of the present disclosure.

The conductor patterns 100 may include lead patterns 111 and 112 respectively provided on uppermost and lowermost sheets 11 and 20 to be exposed to the outside, and coil patterns 121 to 128 provided, for example, spirally on the sheets 12 to 19 between the uppermost and lowermost sheets 11 and 20. The lead pattern 111 extends in a short side direction to be exposed to one long side, and the lead pattern 112 extends from an area corresponding to an inner portion of the lead pattern 111 towards a direction opposite to the lead pattern 111 to be exposed to the other long side which is opposed to the one long side. Also, the coil patterns 121 to 128 are provided on one sheet in a wound shape by at least twice, and provided on the plurality of sheets 12 to 19 in at least two or more shapes. For example, odd-numbered patterns 121, 123, 125 and 127 are formed in a first shape, and even-numbered patterns 122, 124, 126 and 128 are formed in a second shape different from the first shape. Herein, the first and second shapes may be variously formed to have different number of turns, different pattern lengths, or the like. Meanwhile, the conductor patterns 100 including the lead patterns 111 and 112 and the coil patterns 121 to 128 may be provided in plurality to be spaced a predetermined space from each other on the sheets 11 to 20. For example, the number of the lead patterns 111 and 112 may be four and they are spaced apart in a horizontal direction on the sheets 11 and 20; and likewise the number of the coil patterns 121 to 128 may be four and they are spaced apart in a horizontal direction on the sheets 12 to 19. Thus, the plurality of, for example, four unit devices may be provided in a horizontal direction of the sheets 11 to 20. Also, the lead patterns 111 and 112 and the coil patterns 121 to 128 may be vertically connected to each other, and may accordingly function as an inductor having a predetermined resistance and inductance. At this time, since the four conductor patterns 100 are respectively provided in a horizontal direction on the sheets 11 to 20, and the conductor patterns 100 respectively formed on each of the sheets are vertically connected to each other through the vias 200, four inductors may be formed on the first laminate A. That is, the lead patterns 111 on the sheet 11, the coil patterns 121 to 128 formed on the plurality of sheets 12 to 19 under the sheet 11, and the lead patterns 112 on the sheet 20 are connected through the via 200 provided in a predetermined region to implement an inductor wound in a vertical direction, and four inductors may be provided in a horizontal direction. Meanwhile, the resistance and inductance may be adjusted by adjusting the length of the conductor pattern 100. For example, the resistance may be adjusted in a range from several ohms to several tens of ohms by changing at least any one of the number of turns of the coil patterns 121 to 129, or the number of laminated sheets 11 to 20 on which the conductor patterns 100 are formed, thus enabling the inductance to be adjusted. As illustrated in FIG. 3, in an exemplary embodiment of the present disclosure, the first laminate A is configured by laminating ten sheets 11 to 20, but the number of sheets is not limited thereto. In another exemplary embodiment, the number of sheets may be in plurality depending on device characteristics, for example, the inductance, resistance or the like. For example, the first laminate A may be configured by laminating 22 sheets so that the lead electrodes are formed on the uppermost and lowermost sheets and the coil patterns are formed on the remaining sheets.

The via 200 may be formed by filling a conductive material in a predetermined region of at least one sheet on which the conductor pattern 100 is provided. That is, a via-hole formed to vertically penetrate at least one sheet is provided in a predetermined region of at least the one sheet, and the via 200 may be formed by filling the via-hole with the conductive material. The number of the via 200 may be minimized depending on the shape of the conductor pattern 100, and may be formed alternately or spaced apart in a horizontal direction and a vertical direction (top-bottom direction). Also, only one via 200 may be formed for each of the conductor patterns 100 on the sheet, or none of the vias 200 may be formed. That is, the via 200 is not formed on the lowermost sheet 20 among the sheets 11 to 20 on which the conductor pattern 100 is formed, and the via 200 is singly formed for each conductor pattern 100 on the remaining sheets 11 to 19. Here, since the plurality of conductor patterns 100, for example, four conductor patterns 100 are provided on the sheets 11 to 19 to be spaced apart in a horizontal direction, four vias 200 are formed on one sheet. The via 200 may be formed on an end portion of the conductor pattern 100, and the via 200 may include first and second end vias 211 and 212 formed on end portions of the conductor patterns 100, and first and second center vias 213 and 214 formed on central portions of the conductor patterns 100 according to the location at which the via 200 is formed. For example, the first end via 211, the first center via 213, the second end via 212, and the second center via 214 may be repeatedly formed from the uppermost first sheet 11 toward the sheets disposed thereunder. Herein, number of each of the first and second end vias 211 and 212, and the first and second center vias 213 and 214 may be same as the number of unit devices, for example, four. Only one of the end via or the center via is formed on one sheet. Also, the first and second vias 211 and 212 may be formed at different locations from each other, and the first and second center vias 213 and 214 may also be formed at different locations from each other. For example, the first end via 211 may be formed to be adjacent to one long side of the sheet, and the second end via 212 may be formed to be adjacent to the other long side opposed to the one long side of the sheet. Also, the first center via 213 may be formed to be spaced apart from the first end via 211 and to be adjacent to one long side, and the second center via 214 may be formed to be spaced apart from the second end via 212 and to be adjacent to the other long side. The conductor patterns 100 formed on the upper and lower sheets may be electrically or physically connected to each other through the via 200. For example, the first lead electrode 111 may be connected to the first coil pattern 121 on the second sheet 12 through the first end via 211, and the first coil pattern 121 may be connected to the second coil pattern 122 formed on the third sheet 13 through the first center via 213 formed on the second sheet 12. Also, the second coil pattern 122 may be connected to the third coil pattern 123 on the fourth sheet 14 through the second end via 212 formed on the third sheet 13, and the third coil pattern 123 may be connected to the fourth coil pattern 124 on the fifth sheet 15 through the second center via 214 formed on the fourth sheet 14. Since the plurality of vias 200 are dispersively distributed, the number of vias overlapping in a vertical direction decreases, so that deformation of the vias may decrease even through the sheets are laminated and then compressed. Also, since the deformation of the via decreases, various electrical characteristics may be maintained.

The second laminate B includes a plurality of sheets 31 to 33, a plurality of electrode patterns 310 provided on the sheet 32, and common electrode patterns 320 and 330 respectively provided on sheets 31 and 33 which are disposed over and below the sheet 32, and the number of sheets to be laminated is not limited. For example, the sheets 31 and 33 on which the common electrode patterns 320 and 330 are provided may be laminated only over or below the sheet 32 on which the electrode pattern 310 is provided. Alternatively, the sheets 31 and 33 on which the common electrode patterns 320 and 330 are respectively provided may be laminated over and below the sheet 32 as illustrated in FIG. 3. In this case, the electrode patterns 310 are provided to be exposed such that the electrode patterns 310 correspond to the lead patterns 111 and 112, and the common electrode patterns 320 and 330 are provided to be exposed in a direction perpendicular to the electrode patterns 310. That is, the electrode patterns 310 are provided to be spaced apart from each other at a central region to be exposed to one long side and the other long side opposed thereto and to overlap the lead patterns 111 and 112; and the common electrode patterns 320 and 330 are provided across a plurality of unit device regions, and is provided such that a portions thereof are respectively exposed to one short side and the other short side opposed thereto. That is, the electrode pattern 310 and the common electrode patterns 320 and 330 are provided to be exposed in a direction perpendicular with each other.

The plurality of electrode patterns 310 and the common electrode patterns 320 and 330 are internal electrodes facing each other with the sheet 32 therebetween and thus form a capacitor for each unit device. The plurality of electrode patterns 310 formed on one sheet 32 include a pair of electrodes 311 and 312 facing each other in each unit device, and the electrodes 311 and 312 are spaced apart from each other. That is, the electrode pattern 310 may be provided in plurality on the sheet 32 and the number of the electrode patterns may correspond to the number of lead patterns 111 and 112 of the first laminate A. For example, four of the first electrodes 311 may be provided to be spaced apart from each other corresponding to the lead patterns 111, four of the second electrodes 312 may be provided to be spaced apart from each other corresponding to the lead patterns 112, and the first and second electrodes 311 and 312 may also be provided to be spaced apart from each other. The electrode pattern 310 may be provided to have a predetermined area, and in a quadrangular shape as illustrated in FIG. 3. However, the electrode pattern 310 may have different shapes in accordance with another exemplary embodiment, and thus the shape thereof is not particularly limited. Exposed end portions of the electrode patterns 310 are connected to the external electrode 500, that is, a first external electrode 510. One of the exposed one end portions of the plurality of electrode patterns 310 may have a width which is less than that of the other of the exposed end portions. Based on this configuration, spacing between the end portions of each of the electrode patterns 310 is increased, so that the end portions may be suppressed from being connected to each other when the end portions are exposed to be connected to the first external electrode 510. At least one of the end portions of the plurality of electrode patterns 310 may be located to be offset from a center line which bisects the electrode patterns 310. Thus, it is possible to not only evenly adjust but also increase the spacing between the electrode patterns 310. In addition, the capacitance may be adjusted by adjusting the area of the electrode patterns 310.

The common electrode patterns 320 and 330 are provided to be connected to each other across the unit device regions partitioned on the sheet. The common electrode patterns 320 and 330 function as common electrodes connected by each unit device, and are connected to a second external electrode 520. The second external electrode 520 may be connected to a ground terminal. The electrode patterns 310 in each unit device are respectively connected to separate external terminals, but the common electrode patterns 320 and 330 may be connected to a common ground. The shape and area of the common electrode patterns 320 and 330 are not particularly limited, and may be variously modified as long as the common electrode patterns 320 and 330 have areas that face and overlap the electrode pattern 310 formed on each unit device region is sufficient. For example, as illustrated in FIG. 3, the common electrode patterns 320 and 330 have a quadrangular shape similar to the shape of one sheet, and are exposed at an end portion of the sheet. That is, the common electrode patterns 320 and 330 may be provided to extend along a long side direction of the sheet, and exposed to the outside at both short sides. Also, the common electrode patterns 320 and 330 may have the same shape, and may be provided in area region including the first and second end vias 211 and 212 of the first laminate A. Alternatively, the common electrode patterns 320 and 330 may also be provided in an area including at least a portion of the first and second end vias 211 and 212. For example, the common electrode patterns 320 and 330 may be provided such that edges thereof correspond to an imaginary line connecting central portions of the first and second vias 211 and 212 to each other in a long side direction. The common electrode patterns 320 and 330 are provided to be spaced apart in a vertical direction to form a capacitor, the capacitance of which may be changed by adjusting the number and location of the common electrode patterns 320 and 330 to be provided.

Also, the common electrode patterns 320 and 330 may have a non-conductive region 400 in at least a portion of a region opposed to the via 200. For example, as illustrated in FIG. 3, a first non-conductive area 411 may be formed in a region overlapping the first via 211, and a second non-conductive area 412 may be formed in a region overlapping the second via 212. Also, third and fourth non-conductive regions 413 and 414 may be respectively formed in regions overlapping the first and second center vias 213 and 214. The non-conductive region 400 is an insulation region where electric current does not flow, and may include a region in which the sheets 31 and 33 are exposed by removing a portion of the common electrode patterns 320 and 330. That is, the non-conductive region 400 may be formed by removing the common electrode patterns 320 and 330 from the region in which the via 200 overlaps the common electrode patterns 320 and 330. In this way, when the non-conductive area 400 is formed on the common electrode patterns 320 and 330 corresponding to the via 200, the non-conductive region 400 formed on the common electrode patterns 320 and 330 adjacent to the vias 200 is an insulation region even though the vias 200 are pressed or deformed by compression of the laminate compressed during preparation of the laminated chip device. Therefore, an occurrence of a leakage current or a transient current, or a short circuit between the vias 200 and the common electrode patterns 320 and 330 may be suppressed or prevented. Meanwhile, the non-conductive area 400 may be formed to have a size equal to or greater than that of the via 200. For example, a diameter of the via 200 may be from 30 μm to 150 μm, and a diameter of the non-conductive area 400 may be from 30 μm to 300 μm, desirably from 50 μm to 250 μm. Also, a ratio of the size between the via 200 and the non-conductive area 400 may be from 1 to 10 folds, and a ratio of the diameter between the vias 200 and the non-conductive area 400 may be from 1.5 to 9 folds. When the size of the non-conductive area 400 is less than that of the vias 200, the insulating effect will not be sufficiently achieved; and when the size of the non-conductive area 400 is excessively greater than that of the via 200, the insulating effect may be sufficient, but the capacitance may decrease as the area of the common electrode patterns 320 and 330 decreases.

The external electrode 500 is provided outside the laminate 10, and may include the first external electrode 510 connected to the conductor pattern 100 of the first laminate A and the electrode pattern 310 of the second laminate B, and a second external electrode 520 connected to the common electrode patterns 320 and 330 of the second laminate B. The first external electrode 510 is provided on a long-sided first side surface of the laminate 10 and a second side surface opposed thereto, and the second external electrode 520 is provided on a short-sided third side surface of the laminate 10 and a fourth side surface opposed thereto. At this time, the conductor pattern 100 and the electrode pattern 310 are provided by four, for example, and spaced apart in one direction, the first external electrode 510 may be provided by four on each of the first and second side surfaces.

Alternatively, in the laminated chip device in accordance with an exemplary embodiment, a dummy sheet 42 may be provided between the first and second laminates A and B. Providing the dummy sheet 42, space between the first and second laminates A and B is increased, and an interference therebetween may be suppressed or prevented. Alternatively, the dummy sheet 42 may be eliminated, and thickness of a sheet provided at the border between the laminates A and B may be increased. That is, thickness of the lowermost sheet 24 of the first laminate A and the lowermost sheet 31 of the second laminate B may be increased to be greater than that of the other sheets, for example, twice or more. Also, the laminated chip device may also include dummy sheets 41 and 43 on the uppermost and lowermost portion of the whole laminate.

As described above, the laminated chip device in accordance with an exemplary embodiment is connected to the conductor pattern 100 which is configured to function as an inductor (L) to the first external electrode 510, and a capacitor is formed by the electrode pattern 310 connected to the first external electrode 510 and the common electrode patterns 320 and 330 connected to the second external electrode 520. Thus, each unit device may be manufactured as a filter to which one inductor (L) and one capacitor (C) are connected respectively. When a sheet on which the electrode pattern 310 and the common electrode patterns 320 and 330 are provided is made of a sheet of varistor material, the filter may also be manufactured as an inductor-varistor (LV) filter.

FIGS. 3 to 6 are exploded perspective views of a laminated chip device in accordance with modified examples of the present disclosure, and are exploded perspective view of the second laminate B. That is, the modified examples may be implemented by modifying the second laminate B.

As illustrated in FIG. 3, in a first modified example of the present disclosure, the non-conductive region 400 is formed only on the first common electrode pattern 320 provided on the sheet 31. That is, the non-conductive region is not formed on the second common electrode pattern 330 provided on the sheet 33, and a non-conductive region 400 is only formed on the first common electrode pattern 320. Herein, the non-conductive region 400 may include first and second non-conductive regions 411 and 412 respectively formed on a region overlapping with the first and second end vias 211 and 212, and third and fourth non-conductive regions 413 and 414 respectively formed on a region overlapping with the first and second center vias 213 and 214.

Figure 4:
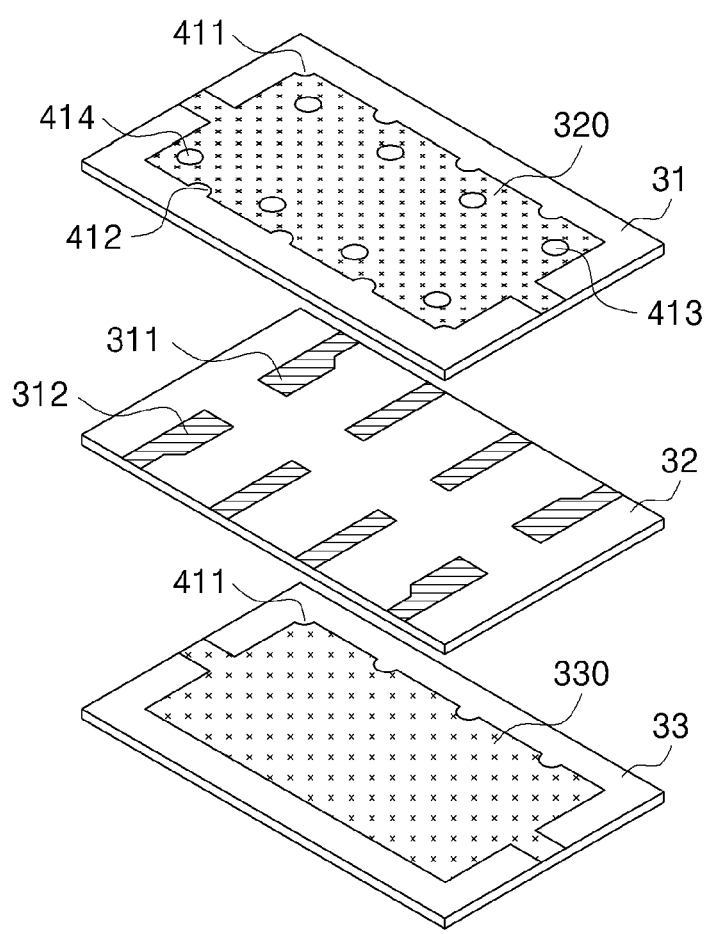

As illustrated in FIG. 4, in a second modified example of the present disclosure, first and second non-conductive regions 411 and 412 and third and fourth non-conductive regions 413 and 414 are formed on the first common electrode pattern 320, and the first non-conductive region 411 is only formed on the second common electrode pattern 330. That is, the whole of the non-conductive region 400 is formed on the first common electrode pattern 320, and a portion of the non-conductive region 400 is formed on the second common electrode pattern 330.

Figure 5:
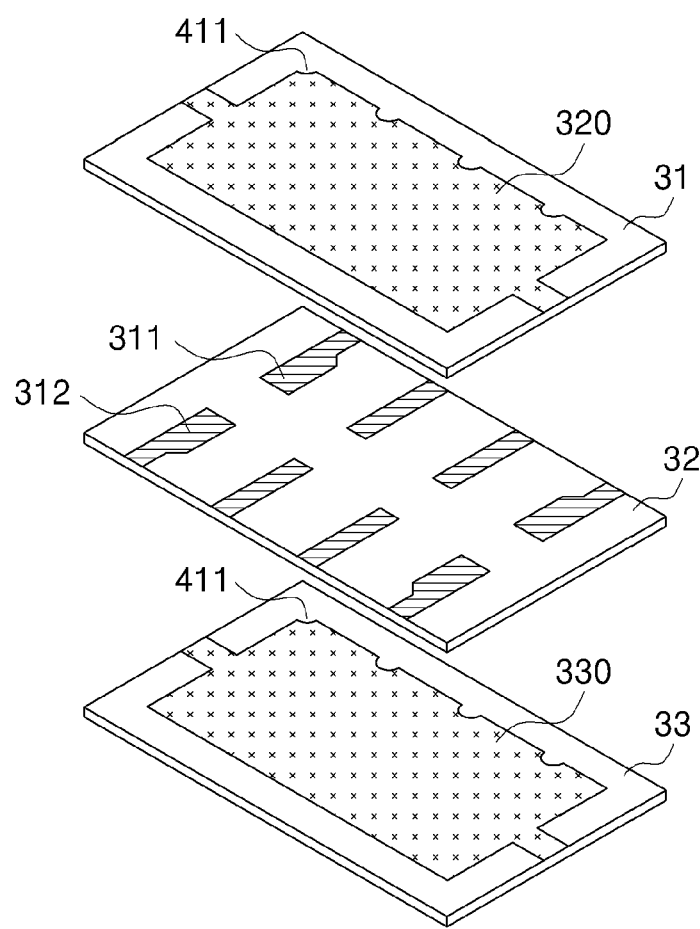

As illustrated in FIG. 5, in a third modified example of the present disclosure, a first non-conductive regions 411 is respectively formed on the first and second common electrode pattern 320 and 330. That is, a portion of the non-conductive region 400 is respectively formed on the first and second common electrode patterns 320 and 330.

Figure 6:
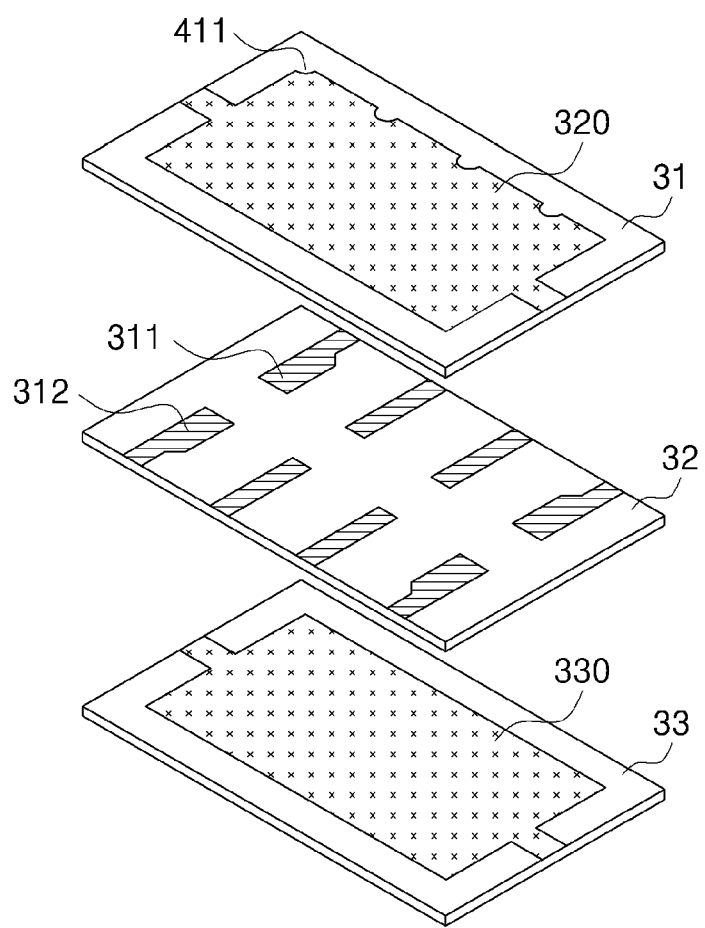

As illustrated in FIG. 6, in a fourth modified example of the present disclosure, a first non-conductive region 411 is formed on the first common electrode pattern 320, and the non-conductive region 400 is not formed on a second common electrode pattern 330. At this time, the non-conductive region may not be formed on the first common electrode pattern 320, but the first non-conductive region 411 may also be formed on the second common electrode pattern 330. That is, a portion of the non-conductive region 400 may be formed on one of the first and second common electrode patterns 320 and 330 while the non-conductive region may not be formed on the other of the first and second common electrode patterns 320 and 330.

Thus, the non-conductive region 400 may include the first and second non-conductive region 411 and 412 corresponding to the first and second end vias 211 and 212; and the third and fourth non-conductive regions 413 and 414 corresponding to the first and second center vias 213 and 214, and at least one of non-conductive regions 400 may be formed on at least one of the first and second common electrode patterns 320 and 330.

A method of manufacturing a laminated chip device in accordance with an exemplary embodiment of the present disclosure described above is briefly described as follows.

First of all, provide a molding sheet for a sheet configured to provide each pattern thereon and to space the pattern in a vertical direction from another. That is, the molding sheet is laminated and then turned into the sheet inside a device through a firing process. The above stated sheet is desirably formed in a rectangular shape, but not limited thereto. The sheet may be possibly formed in a square shape, a polygonal shape including a pentagonal shape, a circular shape, an oval shape, or the like in accordance with a purpose of and place to use the composite laminated chip device which will be finally manufactured. Herein, the molding sheet may be provided to the purpose of the laminated chip to be manufactured. That is, a varistor molding sheet is manufactured for manufacturing a varistor, a capacitor molding sheet is manufactured for manufacturing a capacitor, or an inductor molding sheet is manufactured for manufacturing an inductor. In this exemplary embodiment, the varistor molding sheet is used which normally functions as the capacitor and a resistance thereof drastically changes by an overvoltage. For the above, a commercially available industrial raw material powder of the varistor device is used, or a raw material powder using a composition of ZnO powder added with additives including $Bi_2O_3$, CoO, MnO or the like, and then ball mill processed for 24 hours using water or alcohol as a solvent is alternatively prepared. A PVB-based binder measured by approximately 6 wt. % of the raw material powder and dissolved in a toluene/alcohol-based solvent is input as an additive in the prepared raw material powder of the varistor prepared for the molding sheet to produce a composition, the composition is then milled and mixed for 24 hours using a small ball mill to produce a slurry, and the slurry is turned into a molding sheet having a desired thickness using a doctor blade method or the like. The raw material powder composition for the capacitor and the raw material power composition for a thermistor may also be processed to manufacture the laminated molding sheet having desired thickness. Alternatively, a common molding sheet for an insulator, and a semi-conductive molding sheet may also be used. In addition, a dummy sheet having ferrite patterns printed thereon may be used as the molding sheet for the inductor, or a separate sheet for an inductor such as a ferrite sheet may also be manufactured. Also, same molding sheets or different molding sheets may also be used per each laminate. In this exemplary embodiment, the molding sheet for the varistor having the same material is used in the whole laminates. At this time, in some molding sheets, a through hole formed to penetrate the molding sheet in a vertical direction is formed using a punching apparatus.

A conductive paste including a material such as Ag, Pt, Pd, Ag—Pd, Ni—Cr, $RuO_2$ or the like is printed on the manufactured molding sheet by a screen printing method or the like, using a screen with a specially designed pattern to form a conductor pattern 100, an electrode pattern 310, and common electrode patterns 320 and 330. That is, lead patterns 111 and 112 and coil patterns 121 to 128 are printed on molding sheets 11 to 20 which constitute the first laminate A using the silk screen and the conductive paste, and an electrode pattern 310 and common electrode patterns 320 and 330 are printed on molding sheets 31 to 33 which constitute the second laminate B. At this time, the conductive paste is also filled in the through hole, and thus the through hole is filled to form a via 200. Also, the common electrode patterns 320 and 330 are formed to have at least one non-conductive region 400 in a region corresponding to the via 200. That is, the common electrode patterns 320 and 330 in which the non-conductive region 400 corresponding the via 200 is formed are formed using the silk screen and the conductive paste.

The molding sheets printed with each pattern are laminated to form a structure of the first and second laminates A and B as exemplarily illustrated in FIG. 2. In addition, dummy sheets 41 and 43 to protect the molding sheets are laminated on the uppermost and lowermost portions, and a dummy sheet 42 is positioned between the first and second laminates A and B. Being laminated, the electrode pattern 310 overlaps a portion of the common electrode patterns 320 and 330, and the conductor pattern 100 is connected to each other through the conductor filled in the through hole, that is the via 200.

The laminated laminate is compressed and cut in a proper size. For example, in the case where the unit device is individually cut, the unit device is cut as a single chip, and in the case where a plurality of devices are cyclically cut, the plurality of devices are cut as a single chip. That is, in the case where four unit devices are cut as illustrated in FIG. 2, the four unit devices may be cut as an array type single chip in which the four unit devices are in parallel layout. Practically, forming a pattern formed in one device in a plurality so as to repeatedly appear on a sheet, laminating the sheet, and cutting the laminated sheet in a desired device size may be suitable for mass production.

The laminate is baked out by heating at about 300° C. to remove all organic components such as various binders or the like in the cut laminate, and the laminate is fired at a suitable firing temperature (e.g., about 1100° C.) afterwards by raising the temperature thereto.

The laminated chip device is completed by providing external electrodes 500 on an exterior portion thereof to be connected with each of the conductor patterns 100, the electrode patterns 310, and the common electrode patterns 320 inside the laminate. The external electrode is manufactured by printing electrodes by applying a silver paste (Ag-paste) on a rubber disc having a groove according to the number of electrodes to be formed, that is the number of external electrodes to be printed on a side surface of the fired laminate, for example 4 electrodes or 1 electrode, and positions thereof, and closely rotating (a dipping operation) the rubber disc, and then the manufactured external electrode is fired at a suitable firing temperature. A single chip having 4 unit devices is exemplarily described above, but is not limited thereto. Also, the upper or lower conductor patterns of the first laminate A are exemplarily described to be connected vertically by the via formed to penetrate a sheet, but the conductor patterns may also be connected to each other by various other methods.

A laminated chip device in accordance with an exemplary embodiment of the present disclosure is provided with a non-conductive region on an internal electrode pattern corresponding to a region in which vias are concentrated inside the laminated chip device. Thus, a short circuit, a leakage current and a transient current may be suppressed or prevented, and accordingly, device characteristics may be achieved as originally designed, and thus reliability may be secured.

In addition, in the laminated chip device, a desired electrical characteristic value may be easily controlled by adjusting arrangement of each conductor pattern or electrode pattern, area, shape, number of laminates, or the like.

Meanwhile, the technical idea of the present invention has been particularly described with respect to the exemplary embodiments, but it should be noted that the foregoing embodiments are provided only for illustration while not limiting the present invention. Further, it will be readily understood by those skilled in the art that various modifications and changes can be made thereto without departing from the spirit and scope of the present invention.

What is claimed is:

1. A laminated chip device comprising:
a first laminate including a plurality of conductor patterns respectively provided on a plurality of sheets, the conductor patterns being vertically connected to each other through a via formed to penetrate at least a sheet; and
a second laminate disposed over or below the first laminate and including a plurality of internal electrode patterns provided on a plurality of the sheets, wherein the internal electrode patterns are provided with a non-conductive region in at least a portion of an area corresponding to the via.

2. The laminated chip device of claim 1, wherein the first laminate comprises at least one inductor, and the second laminate comprises at least one capacitor.

3. The laminated chip device of claim 1, wherein the conductor patterns comprise at least one lead pattern extending in one direction and in another direction opposed thereto to be exposed, and a plurality of coil patterns provided between the lead patterns, wherein the lead pattern and the plurality of coil patterns are connected to each other in a vertical direction through the via.

4. The laminated chip device of claim 3, wherein the via comprises first and second end vias provided on end portions of the conductor pattern to be spaced apart from each other in a vertical direction, and first and second center vias provided on a central portion of the conductor pattern to be spaced apart from each other in a vertical direction.

5. The laminated chip device of claim 4, wherein 22 sheets are laminated in the first laminate, the lead patterns are respectively provided on uppermost and lowermost sheets, the coil patterns are respectively provided on the remaining 20 sheets between the uppermost and lowermost sheets, and the coil patterns and the lead patterns are connected to each other in a vertical direction through four vias provided on each sheet.

6. The laminated chip device of claim 5, wherein the internal electrode comprises an electrode pattern provided on one sheet and exposed in the same direction as that of the lead pattern, and common electrode patterns provided over and below the electrode pattern and exposed in a direction perpendicular to the electrode pattern.

7. The laminated chip device of claim 6, wherein the common electrode pattern is provided in a region in which the conductor pattern including the first and second end vias is included.

8. The laminated chip device of claim 7, wherein the common electrode pattern comprises an upper common electrode and a lower common electrode which are respectively provided over and below the electrode pattern,
the non-conductive region being provided on at least one of the upper and lower common electrode patterns.

9. The laminated chip device of claim 8, wherein the common electrode pattern is provided on a sheet, and the non-conductive region comprises a region in which the sheet is exposed by removing a portion of the common electrode pattern.

10. The laminated chip device of claim 9, wherein the non-conductive region is provided to have a size which is equal to or greater than that of the via.

* * * * *